United States Patent [19]

Chen et al.

[11] Patent Number: 5,234,526
[45] Date of Patent: Aug. 10, 1993

[54] WINDOW FOR MICROWAVE PLASMA PROCESSING DEVICE

[75] Inventors: Ching-Hwa Chen, Milpitas; David Pirkle, Soquel, both of Calif.; Takashi Inoue, Tokyo; Takashi Inoue, Nishinomiya; Shunji Miyahara, Itami; Masahiko Tanaka, Amagasaki, all of Japan

[73] Assignee: Lam Research Corporation, Fremont, Calif.

[21] Appl. No.: 705,523

[22] Filed: May 24, 1991

[51] Int. Cl.$^5$ .................. C23C 16/50; H01L 21/00
[52] U.S. Cl. .................. 156/345; 118/723; 333/252
[58] Field of Search .......... 118/723; 156/345; 333/252, 99 PL; 315/111.21, 111.41

[56] References Cited

U.S. PATENT DOCUMENTS

| | | | |
|---|---|---|---|
| 4,393,333 | 7/1983 | Sakudo et al. | 315/111.81 |
| 4,401,054 | 8/1983 | Matsuo et al. | 118/723 |
| 4,409,520 | 10/1983 | Koike et al. | 315/39 |
| 4,414,488 | 11/1983 | Hoffmann et al. | 315/39 |
| 4,831,963 | 5/1989 | Saito et al. | 118/723 |
| 4,857,809 | 8/1989 | Torii et al. | 315/111.31 |
| 4,960,073 | 10/1990 | Suzuki et al. | 118/723 |
| 4,987,346 | 1/1991 | Katzschner et al. | 315/111.41 |

FOREIGN PATENT DOCUMENTS

| | | | |
|---|---|---|---|
| 0236628 | 9/1989 | Japan | 156/345 |
| 0307212 | 12/1989 | Japan | 156/345 |
| 0007330 | 1/1990 | Japan | 315/111.21 |
| 00081434 | 3/1990 | Japan | 156/345 |
| 3-090577 | 4/1991 | Japan | 315/111.21 |
| 3-244123 | 10/1991 | Japan | 156/345 |

OTHER PUBLICATIONS

Webster's II New Riverside University DIctionary, 1988, p. 330.

Primary Examiner—Brian E. Hearn
Assistant Examiner—Jonathan D. Baskin
Attorney, Agent, or Firm—Burns, Doane, Swecker & Mathis

[57] ABSTRACT

A microwave transmitting window for a plasma processing device. The window is a body of one or more pieces of the same or different dielectric materials. A surface of the window facing a microwave transmitting horn or waveguide is planar and extends perpendicularly to an axial direction. An opposite surface of the window is recessed such that the body has a non-uniform thickness between the two surfaces. The recessed surface can have various shapes and the overall size of the window can be equal to the size of a plasma formation chamber of the plasma processing device. The outlet of the plasma formation chamber can be formed in an end wall or the outlet can be formed by the inner periphery of the plasma formation chamber.

37 Claims, 11 Drawing Sheets

WINDOW FOR MICROWAVE PLASMA PROCESSING DEVICE

FIELD OF THE INVENTION

The present invention relates to a microwave plasma processing device useful as an etching device or a film-forming device in which plasma is generated by microwaves with or without electron cyclotron resonance excitation.

BACKGROUND OF THE INVENTION

The advantages of devices in which plasma is generated by electron cyclotron resonance excitation are that a highly active plasma can be generated at low gas pressures, ion energies can be chosen from a wide range of magnitudes, large ionic currents can be realized, excellent directivity and homogeneity of ionic currents can be achieved, etc. These are the reasons for the continued research and development of such devices which are considered indispensable in manufacturing high-density semiconductor elements and other devices.

FIG. 1 is a longitudinal section of a conventional microwave plasma processing device (e.g. see U.S. Pat. No. 4,401,054) which is intended to be used as an etching device and which operates on the principle of electron cyclotron resonance excitation initiated by microwaves.

As shown in FIG. 1, plasma generation chamber 31 has double peripheral walls forming a cooling water conduction chamber 31a, microwave lead-in opening 31c sealed with quartz glass plate 31b is in the center of the upper wall, and plasma withdrawal opening 31d is in the center of the lower wall opposite microwave lead-in opening 31c. Waveguide 32 has one end thereof connected to microwave lead-in opening 31c. Sample chamber 33 is positioned facing plasma withdrawal opening 31d, and exciting coils 34 are placed coaxially both with plasma generation chamber 31 and with waveguide 32 connected to it, while coils 34 enclose both chamber 31 and the end portion of waveguide 32.

Sample stage 37 is located opposite plasma withdrawal opening 31d inside sample chamber 33. A wafer or some other sample S is mounted on stage 37 by being placed in a simple manner on top of stage 37 or by being detachably mounted through the intermediary of electrostatic clamping or other conventional means. Furthermore, evacuation port 33a connected to an evacuation device (not shown) is furnished in the lower wall of sample chamber 33.

Gas supply system 31g is connected to plasma generation chamber 31 and gas supply system 33g is connected to sample chamber 33. Cooling water supply and drainage systems 31h, 31i circulate cooling water in chamber 31a.

In an etching device of this type, gas is supplied into plasma generation chamber 31 through gas supply system 31g after a required degree of vacuum is obtained both in plasma generation chamber 31 and in sample chamber 33, and a magnetic field is formed by exciting coils 34 while microwaves are introduced into plasma generation chamber 31 through microwave lead-in opening 31c, with plasma being formed as a result of resonance excitation initiated in the gas inside plasma generation chamber 31 which serves as a cavity resonator. A divergent magnetic field formed by exciting coils 34 and having a magnetic flux density which diminishes in the direction of sample chamber 33 projects the generated plasma into the area occupied by sample S in sample chamber 33, thereby ensuring that the surface of sample S inside sample chamber 33 is etched (see Japanese Laid-Open Patent Application No. 57-133636).

In the conventional device described above, microwave lead-in opening 31c in the upper wall of plasma generation chamber 31 is sealed airtight by quartz glass plate 31b which is penetrable by microwaves. Quartz glass plate 31b is additionally secured by fastener 32b which is arranged along the outer periphery of microwave lead-in opening 31c, sealing opening 31c and overlapping flange 32a at the end portion of waveguide 32.

Therefore, when plasma generation chamber 31 functions as a cavity resonator for microwaves, the inside portion of microwave lead-in opening 31c becomes an additional empty space which creates a sharp change in level with respect to the inner surface of plasma generation chamber 31, thereby causing an abnormal reflection of microwaves in this area and, therefore, impairing the homogeneity of plasma distribution. As a measure intended to overcome this disadvantage, the device shown in FIG. 2 has been proposed (see Japanese Laid-Open Patent Application No. 63-318099).

As shown in FIG. 2, microwave-penetrable substance 48 is inserted into microwave lead-in opening 31c (which opens into plasma generation chamber 31) in a manner ensuring that the substance, when it fills up the space, stays uniplanar with the inner surface of the plasma generation chamber. Other elements are essentially the same as shown in FIG. 1, with identical units being assigned identical numbers.

Microwave-penetrable substance 48 is composed of two components: (a) disk 48a which has a diameter and axial size roughly equal to those of microwave lead-in opening 31c and (b) circular flange 48b which is on top of disk 48a and has dimensions larger than those of the disk 48a. The lower surface of disk 48a is positioned in such a manner as to be uniplanar with the inner surface of plasma generation chamber 31, with disk 48a being tightly fitted into microwave-penetrable opening 31c and an O-ring being inserted along the outer between opening 31c and flange 48b.

Therefore, microwave lead-in opening 31c in the upper wall of plasma generation chamber 31 is filled tightly through the intermediary of microwave-penetrable substance 48, thereby excluding any anomalous reflection of microwaves. The result is the corresponding reduction in the reflection factor of microwaves and an increase in the homogeneity of generated plasma.

However, a drawback of such a conventional device is an insufficient homogeneity of plasma distribution which is the result of a difference in diameters between microwave lead-in opening 31c and plasma generation chamber 31, with prevention of anomalous reflection caused by this difference being insufficient, thereby generating a complex distribution of the microwave magnetic field.

U.S. Pat. No. 4,960,073 (37 Suzuki"), assigned to Anelva Corp. in Japan, discloses a conventional microwave plasma treatment apparatus wherein electron cyclotron resonance (ECR) is utilized to form a plasma which is used to carry out surface treatments of a substrate. The surface treatments include etching, thin film deposition and formation of thin film. The apparatus includes a plasma generating chamber separated from a reaction chamber by a quartz ring which forms a plasma extracting aperture. One or more solenoids are provided around the outer periphery of the plasma chamber for forming a magnetic field inside the plasma chamber. Gas is introduced into the plasma chamber through one or more conduits which open into the plasma through an upstream end wall of the plasma chamber opposite to the quartz ring which forms a downstream end of the plasma chamber. The plasma and reaction chambers are maintained at subatmospheric pressure by suitable vacuum pumping means. Plasma is generated in the plasma chamber by introducing gas into the plasma chamber, by activating the solenoids to produce the magnetic field in the plasma chamber and by introducing microwaves through a window in the upstream wall.

Suzuki provides an even-numbered plurality of auxiliary magnets between the periphery of the plasma chamber and the solenoid coils. The auxiliary magnets are symmetrically arranged circumferentially around the central axis of the plasma chamber such that the polarity of adjacent magnets is reversed and to form a strong magnetic field locally in the vicinity of the inner wall surface of the plasma chamber to heighten plasma density in the vicinity of the inner wall. According to Suzuki, plasma density is substantially more uniform from the central axis to the vicinity of the inner wall and more uniform ionic current density distribution can be obtained in the reaction chamber.

Suzuki's apparatus includes a microwave introducing window made of a dielectric such as quartz glass or ceramic material and having a uniform thickness. A horn-like portion is provided between a waveguide pipe and the window. In addition, a block for propagating microwaves is provided in the plasma chamber around the window, the block having a horn-like inner surface, the diameter of which increases along the central axis in a direction away from the window. In another arrangement, the microwave introducing window is replaced by a wineglass-shaped wall, i.e., a bell jar. The wall is open at a downstream end thereof and closed at an upstream end. The wall is of uniform thickness and of dielectric material. The open end of the dielectric wall abuts a quartz ring having a plasma extraction orifice therein and the closed end of the dielectric wall extends part way into a wide end of a horn joined to a wall between the auxiliary magnets and the dielectric wall.

U.S. Pat. No. 4,857,809 ("Torii"), assigned to Nippon Telegraph and Telephone in Japan, discloses a microwave ion source utilizing a microwave and a magnetic field, the microwave being introduced through a window having a multilayered structure of plates with different dielectric constants. Torii utilizes a magnetic circuit outside the plasma generating chamber to produce a magnetic field intensity at least near a microwave introducing window at a value higher than that needed to generate electron cyclotron resonance (ECR). As a result, a narrow high-intensity plasma mode is generated such that the plasma density is higher at the center region of the plasma generation chamber. Torii provides an ion extraction electrode system between the plasma and reaction chambers to extract an ion beam from the center region of the narrow high-density plasma. The multilayered window includes a main window sealing the waveguide from the plasma chamber and an auxiliary window in the plasma chamber to protect the main window from a back stream of electrons which could otherwise damage the main window. The main window can be quartz and the auxiliary window can be alumina or a double layer of alumina and boron nitride.

U.S. Pat. No. 4,987,346 ("Katzschner"), assigned to Leybold AG in Germany, discloses an apparatus for reactive ion beam etching or plasma deposition. Katzschner discloses that the apparatus can generate a plasma beam having an effective diameter of more than 200 mm and homogeneity of the particle current density of over 95%. The apparatus utilizes a combination of torus-shaped magnetic fields with the microwave coupling in via an E-sector, H-sector, pyramidal or conical horn radiator. One or two sets of annular sets of magnets can also be used and the plasma chamber comprises a quartz container to minimize plasma impurities. For instance, a cone-shaped horn radiator can extend between a microwave waveguide and the end face of the quartz container and two annular permanent magnets with reversed polarities can surround the quartz container with an annular iron yoke surrounding both magnets whereby the torus-shaped magnetic field is generated within the quartz container. An electromagnet surrounds the horn radiator to generate field lines parallel to the center axis of the horn. An extraction device including three extraction grids is located at the exit of the quartz container.

Other arrangements of microwave windows are shown in U.S. Pat. No. 4,414,488 ("Huffmann"), U.S. Pat. No. 4,409,520 ("Koike") and U.S. Pat. No. 4,393,333 ("Sakudo").

SUMMARY OF THE INVENTION

According to one aspect of the invention, a microwave transmitting window is provided which includes a solid body of dielectric material, the body including first and second surfaces spaced apart in an axial direction and an outer periphery extending between the first and second surfaces. The first surface is planar and extends perpendicularly to the axial direction. The second surface is recessed such that the body has a non-uniform thickness between the first and second surfaces, the thickness increasing in a direction towards the outer periphery.

The first surface can be a continuous, uninterrupted surface extending inwardly from the outer periphery and the second surface can be a continuous, uninterrupted surface extending inwardly from the outer periphery. The outer periphery can be a continuous, uninterrupted surface extending axially from the first surface to the second surface and the outer periphery can have a uniform width in a transverse direction perpendicular to the axial direction. The body can be cylindrical or rectangular in axial cross-section.

The recessed surface can be conical or spherical or hyperbolic or parabolic with respect to the axial direction. Alternatively, the recessed surface can include a conical central portion and a frusto-conical outer portion, the frusto-conical outer portion being tapered with respect to the axial direction to a lesser extent than the conical central portion. The recessed surface can be pyramidal in shape and formed by four triangular surfaces or the recessed surface can include a pyramidal central portion formed by four triangular surfaces and a truncated outer portion formed by four trapezoidal surfaces. The truncated outer portion can be tapered with respect to the axial direction to a lesser extent than the pyramidal central portion.

The recessed surface can extend radially inwardly from the outer periphery of the body or the second surface can include an outer planar portion extending perpendicularly to the axial direction and the recessed surface can extend radially inwardly from the outer planar portion. The recessed surface can also be frusto-conical with the second surface including a planar outer portion and a planar central portion, the frusto-conical surface extending from the central portion to the outer portion.

A metal shield can cover a central portion of the recessed surface. A flange can extend radially outwardly from the outer periphery of the body and the flange can be adjacent the first surface of the body.

The body can comprise at least two discrete parts. Alternatively, the body can be combined with a member of dielectric material having a planar surface abutting the planar surface of the body. The member can have an outer periphery spaced radially inwardly of the outer periphery of the body.

According to another aspect of the invention, a plasma generating device is provided which includes a plasma formation chamber, a reaction chamber and a microwave transmitting window. The plasma formation chamber has first and second ends thereof spaced apart in an axial direction, a first opening in the first end for passing microwave energy into the plasma formation chamber and a second opening in the second end for passing plasma outwardly of the plasma formation chamber. The reaction chamber is adjacent the second end of the plasma formation chamber, the reaction chamber including a substrate support aligned in the axial direction with the second opening. The microwave transmitting window seals the first opening, the window comprising a body of dielectric material. The body includes first and second surfaces spaced apart in the axial direction and an outer periphery extending between the first and second surfaces. The first surface is planar and extends perpendicularly to the axial direction. The second surface is recessed such that the body has a non-uniform thickness between the first and second surfaces, the thickness increasing in a direction towards the outer periphery.

According to a further aspect of the invention, a microwave plasma processing device is provided which includes a plasma generation chamber which generates plasma by exciting electron cyclotron resonance using microwaves introduced through a microwave lead-in opening in an end wall of the plasma formation chamber, the microwave lead-in opening having a cross-section smaller than the cross-section of the plasma formation chamber. The microwave plasma processing device includes a microwave-penetrable substance on a side of the plasma generation chamber facing the microwave lead-in opening and the microwave-penetrable substance extends over the entire cross-section of the chamber. The microwave-penetrable substance can have a thickness which increases in a direction from a center of the plasma generation chamber to a periphery thereof.

According to another aspect of the invention, a microwave plasma processing device is provided which includes a plasma generation chamber which generates plasma by exciting electron cyclotron resonance using microwaves introduced through a microwave lead-in opening. The microwave plasma processing device includes a first microwave-penetrable substance supported in the microwave lead-in opening so as to allow the first microwave-penetrable substance to become uniplanar with an inner surface of the plasma generation chamber. A second microwave-penetrable substance is supported on a side of the plasma generation chamber facing the microwave lead-in opening and the second microwave-penetrable substance extends over an entire cross-section of the chamber. The microwave-penetrable substance can have a thickness which increases in a direction from a center of the plasma generation chamber to a periphery thereof.

BRIEF DESCRIPTION OF THE DRAWING

FIG. 12 shows a modification of the window shown in FIG. 6a;

DETAILED DESCRIPTION OF THE PREFERRED EMBODIMENTS

The present invention provides a microwave plasma processing device which is characterized by a low reflection factor of microwaves and is capable of generating homogeneous plasma in a stable and effective manner.

According to one aspect of the invention, a microwave plasma processing device includes a plasma generation chamber intended to generate plasma by exciting electron cyclotron resonance using microwaves introduced through a microwave lead-in opening in an end wall of the chamber, the opening having a cross-section smaller than a cross-section of the chamber. A microwave-penetrable substance is located on a side of the chamber facing the microwave lead-in opening over the entire cross-section of the chamber.

According to another aspect of the invention, a microwave plasma processing device includes a plasma generation chamber intended to generate plasma by exciting electron cyclotron resonance using microwaves introduced through a microwave lead-in opening, a first microwave-penetrable substance is in the microwave lead-in opening such that the substance is uniplanar with the inner surface of the plasma generation chamber, and a second microwave-penetrable substance is on a side of the plasma generation chamber facing the microwave lead-in opening over an entire cross-section of the chamber.

According to the above-mentioned features of the present invention, the microwave lead-in opening and a part of the plasma generation chamber situated next to the opening are packed with a microwave-penetrable substance and the gas intended for plasma generation is removed from the area, which, in combination with the optimum distribution of the electric field strength, the homogeneity of the microwave-propagating material and the increase in the impedance matching, makes it possible to produce a uniform plasma distribution.

Figure 1:
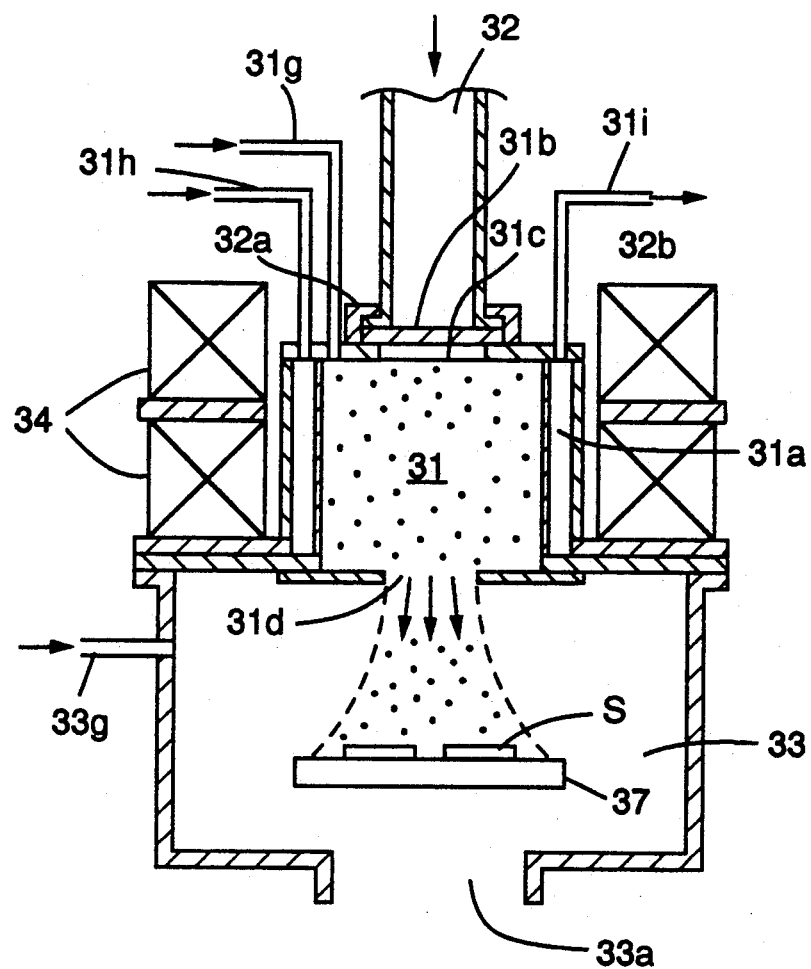
FIGS. 1 and 2 are, respectively, schematic cross-sections of conventional arrangements of parts of a plasma generating device.
Figure 2:
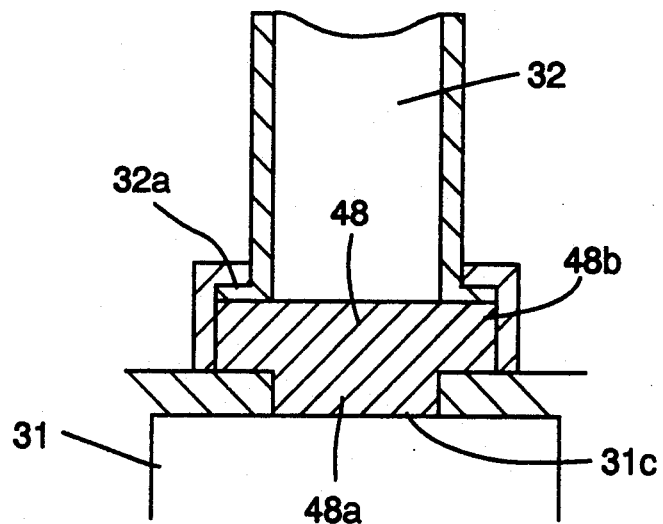
Figure 3:
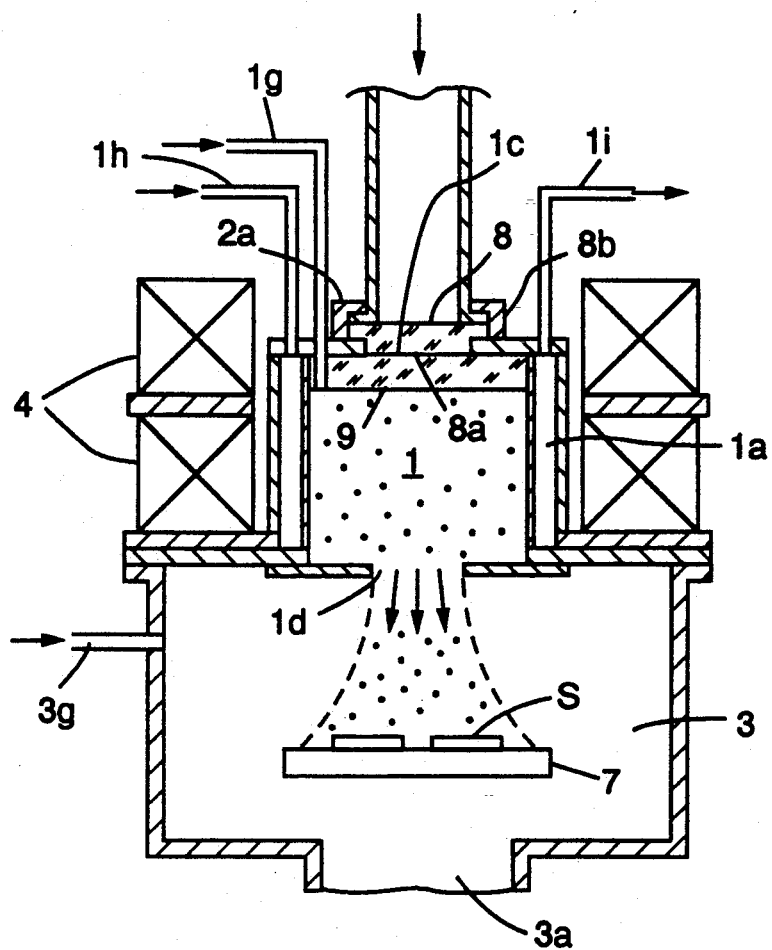
FIG. 3 is a longitudinal cross-section of a microwave window arrangement of a plasma generating device according to the present invention.

FIG. 3 is a longitudinal section of one microwave plasma processing device pertaining to the present invention. The device includes plasma generation chamber device 1, waveguide 2, sample chamber 3 intended for holding sample S to be either etched or provided with a film, and exciting coils 4.

Plasma generation chamber 1 has double peripheral walls, which form a hollow cylinder furnished with cooling water conduction chamber 1a, and is of a configuration that permits chamber 1 to perform the function of a cavity resonator for microwaves. Microwave lead-in opening 1c is furnished in the center of the upper wall, and plasma withdrawal opening 1d is located in the center of the lower wall opposite microwave lead-in opening 1c.

One end of waveguide 2 is connected to microwave lead-in opening 1c, while sample chamber 3 is arranged so that it faces plasma withdrawal opening 1d, and exiting coils 4 are placed both around plasma generation chamber 1 and around one end of waveguide 2 connected to chamber 1.

The other end of waveguide 2 is connected to a microwave generator (not shown) which generates microwaves to be introduced into plasma generation chamber 1. Furthermore, exciting coils 4 are connected to a direct current source (not shown) and form a magnetic field when a direct current is passed through them. Plasma is generated as a result of microwaves being introduced into plasma generation chamber 1, exciting coils 4 producing a divergent magnetic field which has the magnetic flux density thereof decreasing in the direction towards sample chamber 3. Plasma generated in plasma generation chamber 1 is projected into sample chamber 3 by the divergent magnetic field.

Evacuation port 3a is furnished in the bottom wall of sample chamber 3 opposite plasma withdrawal opening 1d and is connected to an evacuation device (not shown). Inside chamber 3, sample stage 7 is located immediately beneath and opposite plasma withdrawal opening 1d, with sample S being placed on top of sample stage 7 opposite the plasma withdrawal opening 1d.

Microwave-penetrable substances 8 and 9 are located both inside microwave lead-in opening 1c and inside that end portion of plasma generation chamber 1 which faces microwave lead-in opening 1c. Microwave-penetrable substance 8 is composed of two parts: (a) disk 8a which has a diameter and axial size almost equal to those of microwave lead-in opening 1c and (b) circular flange 8b which is situated on top of disk 8a and which is provided with dimensions larger than those of disk 8a. The lower surface of disk 8a is positioned in such a manner as to make it uniplanar with the inner surface of plasma generation chamber 1, with disk 8a being tightly fitted into microwave-penetrable opening 1c and an O-ring being inserted in an airtight fashion along the outer periphery of microwave-penetrable lead-in opening 1c between opening 1c and flange 8b. Collar 2a fits over an end of waveguide 2 and flange 8b.

Furthermore, microwave-penetrable substance 9 is shaped as a disk which has a specified thickness and a diameter approximately equal to the diameter of plasma generation chamber 1. Disk-shaped substance 9 is inserted and tightly fixed to the upper surface of plasma generation chamber 1 in such a manner as to ensure that disk-shaped substance 9 is in contact both with the upper wall of plasma generation chamber 1 and the lower wall of microwave-penetrable substance 8. Satisfactory matching is obtained when the thickness of microwave-penetrable substance 9 is made equal to ¼ of the wavelength inside waveguide 2, multiplied by a factor which is an integral number, with the wavelength being determined by the mode matching analysis relating to the microwave propagation theory.

For instance, when plasma generation chamber 1 performs the function of a circular resonator which is in the $TE_{113}$ mode with respect to microwaves having a frequency of 2.45 GHz, it is known that the microwave reflection diminishes when the thickness of microwave-penetrable substance 9 is approximately 16 mm, with the diameter of plasma generation chamber 1 being 200 mm.

Microwave-penetrable substances 8 and 9 may consist of quartz glass, ceramics ($Al_2O_3$, BN), refractory macromolecular materials (Teflon ®, polyimides), etc. The substances can be arranged in the manner shown in FIG. 3 after they are shaped as solid bodies or are made into granules which are then used to fill spaces between partitions.

The device includes gas supply tubes 1g and 3g and cooling water supply and drainage systems 1h, 1i, respectively. Gas supply tube 1g goes both through the upper wall of plasma generation chamber 1 and through microwave-penetrable substance 9, and opens into plasma generation chamber 1.

In such a device of the present invention, sample S is placed on sample stage 7 inside sample chamber 3, and gas is supplied both into plasma generation chamber 1 and into sample chamber 3 through gas supply tubes 1g and 3g after a required degree of vacuum has been established inside sample chamber 3, with the accompanying passing of a direct current through exciting coils 4 and the simultaneous introduction of microwaves into plasma generation chamber 1 through waveguide 2, microwave lead-in opening 1c and microwave-penetrable substances 8 and 9. As a result, gas is dissociated in an effective manner, and the generated plasma is introduced into sample chamber 3 with the aid of a divergent magnetic field produced by exciting coils 4, thereby activating the gas inside sample chamber 3 and providing for the etching or film-forming to be conducted on the surface of sample S.

Figure 4:
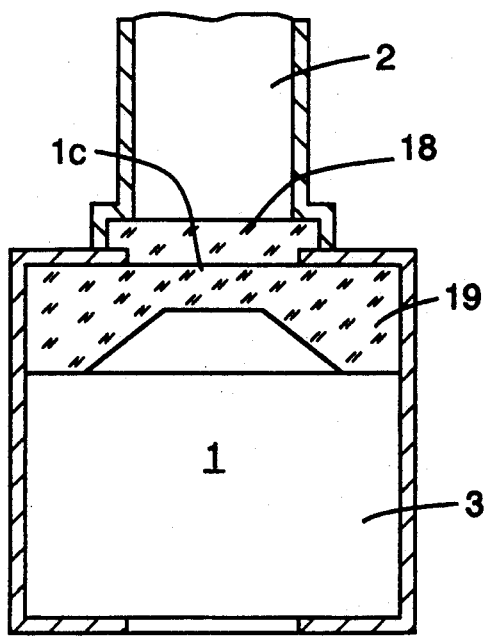
FIG. 4 is a schematic cross-section of another microwave window arrangement according to the present invention.

FIG. 4 is a schematic cross-section of another practical example pertaining to the present invention. In this example, microwave-penetrable substance 18 is located inside waveguide 2 and microwave-penetrable substance 19, which is placed in plasma generation chamber 1 at the side closest to microwave lead-in opening 1c, has the lower surface thereof shaped as a truncated cone, which forms a cavity situated opposite microwave lead-in opening 1c, thereby resulting in a substance that has a minimum thickness in the central portion of plasma generation chamber 1 opposite microwave lead-in opening 1c, with the thickness increasing gradually in the radial direction.

The electric field strength in the $TE_{113}$ mode is usually high in the central portion, providing microwave-penetrable substance 19 with the configuration shown in FIG. 4 producing a lens effect with respect to electromagnetic waves, resulting in a relative increase of the peripheral electric field and in an enhanced homogeneity of plasma.

Figure 5:
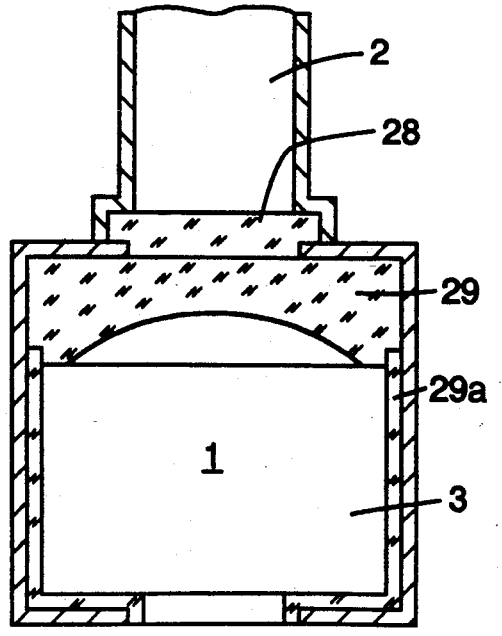
FIG. 5 is a schematic cross-section of a further microwave window arrangement according to the present invention.

FIG. 5 is a schematic cross-section of yet another practical example pertaining to the present invention. In this example, microwave-penetrable substance 28 is located inside waveguide 2 and the lower surface of microwave-penetrable substance 29 is made hollow in the form of a partial sphere, thereby ensuring that substance 29 has the least thickness in a position corresponding to microwave lead-in opening 1c, with the thickness gradually increasing in the peripheral direction. At the same time, liner 29a made of a microwave-penetrable substance covers the side walls and the lower wall of plasma generation chamber 1. Liner 29a makes it possible to preclude any contamination of samples resulting from the plasma being intermixed with heavy metal ions formed when the plasma generated in plasma generation chamber 1 comes into contact with the surrounding metallic walls of the chamber.

When quartz glass is used as microwave-penetrable substance 29 in this practical example, the thickness in the center is 16 mm and the radius of curvature of the inner surface is about 150 mm. The thickness distribution, or the optimum configuration, of microwave-penetrable substance 29 depends on such characteristics of generated plasma as the plasma density and the dielectric constant of plasma, which are, in turn, determined by the distribution of magnetic field strength, gas pressure, and other parameters that serve as a basis for selecting required numerical values and configurations.

Although the devices shown in FIGS. 3–5 have been explained with reference to etching or film-forming devices, their scope is in no way limited to these devices and can also be incorporated into sputtering devices, sintering devices, or other apparatuses.

As has already been stated above, the present invention makes it possible to increase the homogeneity of the electric field strength in the case of microwaves, to suppress the anomalous reflection, to produce a uniform plasma distribution and to attain some other results such as with regard to vacuum sealing and contamination control which render the present invention extremely effective.

According to a further aspect of the invention, a dielectric microwave/transformer window is used for controlling microwave transmission and power distribution. Additionally, the microwave window/transformer can provide a barrier to isolate a processing region from the microwave transmission system.

Figure 6A:
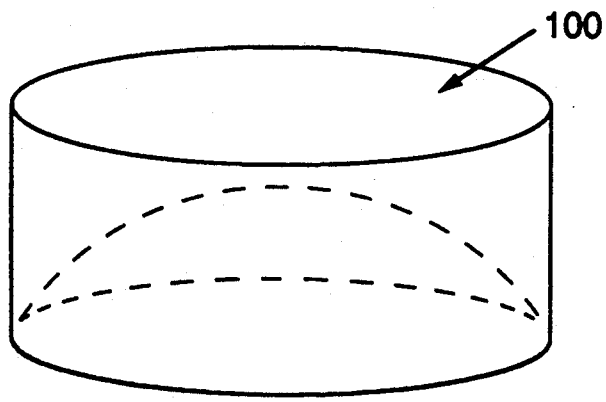
FIGS. 6a–b show perspective and cross-sectional views, respectively, of a microwave window in accordance with the invention.
Figure 6B:
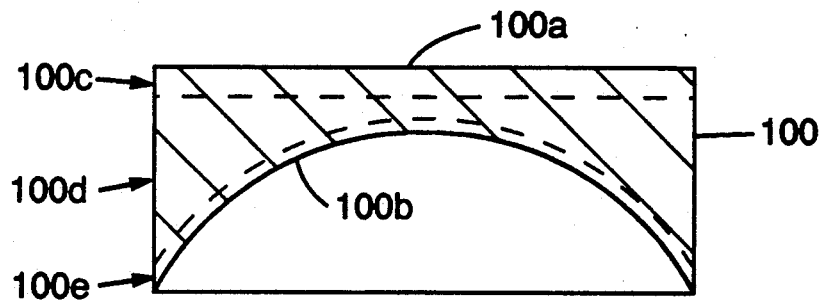

FIGS. 6a–b show perspective and cross-sectional views, respectively, of microwave/transformer window 100 in accordance with the invention. Window 100 consists of a dielectric disk with a characteristic cross-section. The exact cross-section shape is determined by the dielectric constant of the material and the desired microwave transmission and power distribution. However, the general shape of microwave/transformer window 100 is thinner at the center and thicker at the edges.

The dimensions of the cross-section of microwave/transformer window 100 are chosen to optimize microwave transmission from the waveguide into the processing region and to increase the microwave electric field amplitude at the outer diameter of the disk. Microwave/transformer window 100 improves ion density uniformity in a plasma source. However, microwave window/transformer 100 would also be useful for other microwave processing applications such as drying, curing and sintering, where a region with a spatially uniform microwave electric field is desired. Additionally, microwave window/transformer 100 can provide a physical barrier to isolate the processing region from the microwave transmission system. This barrier is useful if the microwave transmission system operates at a different temperature, pressure, or chemical environment from the processing region.

Figure 7A:
FIGS. 7a–c show cross-sections of conventional microwave windows.
Figure 7B:
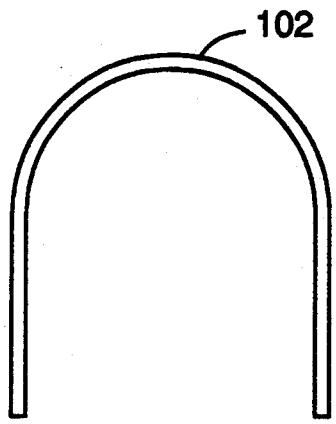
Figure 7C:
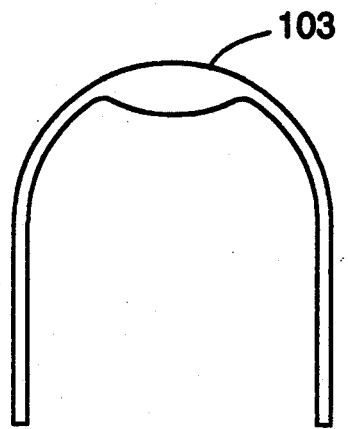

Currently, plasma sources that are powered by microwaves use a microwave window with uniform cross-section 101 (FIG. 7a) and 102 (FIG. 7b), or a cross-section that is thicker in the middle than at edge 103 (FIG. 7c). The ion density produced in these plasma sources is peaked on the axis of the plasma source and decreases towards the outer diameter, unless some other measures are taken to improve the uniformity of the plasma density, such as special magnetic confinement of the plasma, or a microwave waveguide mode converter.

The advantages of microwave/transformer window 100 are that it is a compact hardware the combines the functions of impedance matching between the microwave transmission system and processing region, and physical isolation of the microwave transmission system from the processing region. More importantly, microwave/transformer window 100 increases the amplitude of the microwave electric field at the outer diameters of the window over what they would be without the window. The increase in the electric field amplitude occurs independently of the particular waveguide mode that is transmitted through the transformer window. Many processes utilizing microwaves, such as microwave plasma production, microwave curing or drying of materials, and microwave ceramic sintering, depend on an interaction with the microwave electric field. In these processes, controlling the microwave electric field amplitude in the processing volume is an important factor for controlling the process uniformity. This invention modifies the microwave electric field amplitude in the outer diameters of the processing volume, allowing improved process uniformity.

Figure 8:
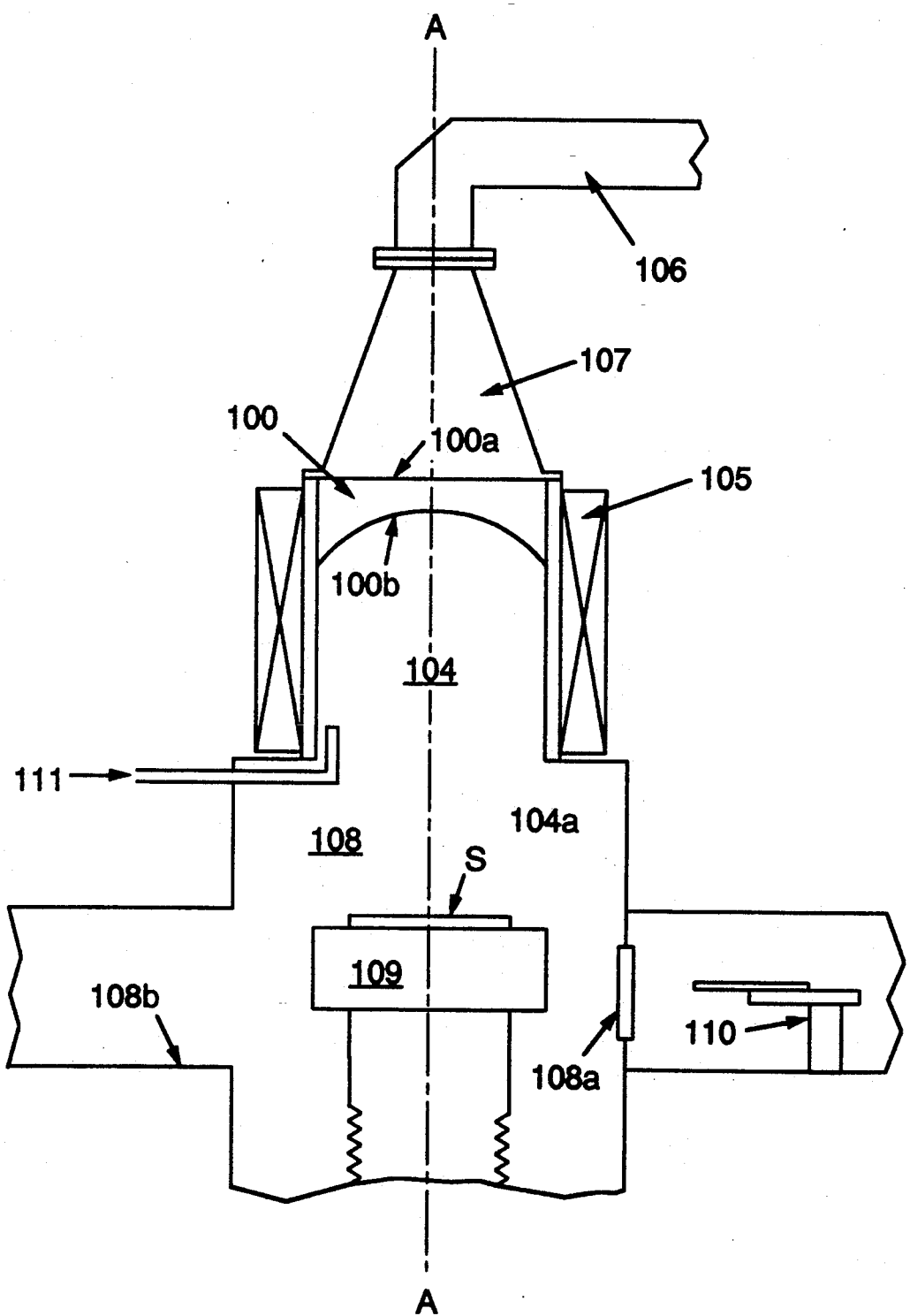
FIG. 8 shows a cross-section of an apparatus which includes the microwave window shown in FIGS. 6a–b.

Microwave/transformer window 100 improves the uniformity of reactive species in an electron cyclotron resonance (ECR) plasma device. The plasma device can be used as a component of an etching or deposition tool for semiconductor processing wherein one or more wafers are processed. FIG. 8 shows microwave/transformer window 100 and its relation to other components of such an ECR plasma source etcher. The device includes plasma formation chamber 104, exciting coils 105, microwave guide 106, horn 107, reaction chamber 108, specimen table 109, specimen transfer mechanism 110 and gas introducing conduit 111. As shown in FIG. 8, window 100 seals cylindrical microwave guide 106 from plasma formation chamber 104 which is usually evacuated to subatmospheric pressure during a plasma etching or plasma enhanced chemical vapor deposition process. Microwaves from a microwave power source (not shown) pass through microwave guide 106, frusto-conically shaped horn 107 and through window 100 into cylindrical plasma formation chamber 104. Window 100 has a diameter equal to the diameter of plasma formation chamber 104. Surface 100a of window 100 faces a cavity in horn 107 and lies in a plane which is perpendicular to central axis A of plasma formation chamber 104. Surface 100b of window 100 is recessed and faces plasma formation chamber 104.

Plasma formed in plasma formation chamber 104 passes through open end 104a of plasma formation chamber 104 into reaction chamber 108. Substrate S is supported on substrate support (specimen table )109 in reaction chamber 108. Substrate transfer means (specimen transfer mechanism) 110 transfers substrates S to and from substrate support (specimen table) 109 through port 108a. Reaction chamber 108 and plasma formation chamber 104 are evacuated by suitable pumping means (not shown) through port 108b. Gas is supplied directly into plasma formation chamber 104 by one or more gas introducing conduits 111. Alternatively, gas can be supplied only into reaction chamber 108 or gas can be supplied into reaction chamber 108 and into plasma formation chamber 104.

One purpose of plasma formation chamber 104 is to produce reactive species (ions and radicals) for etching wafers. To be useful, the etcher must etch all areas of the wafer at the same rate. One way to achieve etch uniformity is to make the plasma formation chamber 104 much larger than the wafer that is being etched. In this case, only a small portion of the plasma area is used for etching, and achieving uniformity of the reactive species over that small area is easy. This approach is practical for wafer sizes of 3"-5" diameter. However, for wafers 6" diameter and larger, material costs and size considerations provide a strong incentive to produce a uniform distribution of reactive species over a large area in plasma formation chamber 104. The present invention can improve the uniformity of microwave electric fields in plasma formation chamber 104, which is an important factor for improving the uniformity of reactive species. In addition, the invention can provide a good impedance match and physical isolation of low-pressure corrosive plasma from the microwave transmission system.

Reactive species are created in plasma formation chamber 104 by energetic electrons bombarding the process gas molecules that are flowing into plasma formation chamber 104. External electromagnets (exciting coils) 105 produce a magnetic field that causes electrons in plasma formation chamber 104 to orbit at the cyclotron frequency. The cyclotron frequency is given by:

$$f = 2\pi qBm = 2.8 \text{ GHz/kG B (in kG)}$$

where:
q = electron charge
B = magnetic field amplitude
m = electron mass.

Right-hand circularly-polarized microwave electric fields transmitted into plasma formation chamber 104, which oscillate at this characteristic cyclotron frequency, resonantly accelerate electrons to energies capable of producing reactive species. The electron acceleration is proportional to the microwave electric field amplitude. In order to produce reactive species uniformly, the microwave electric fields should be uniform. However, conventional techniques for exciting microwaves in plasma formation chambers produce non-uniform microwave electric field patterns.

Figure 9A:
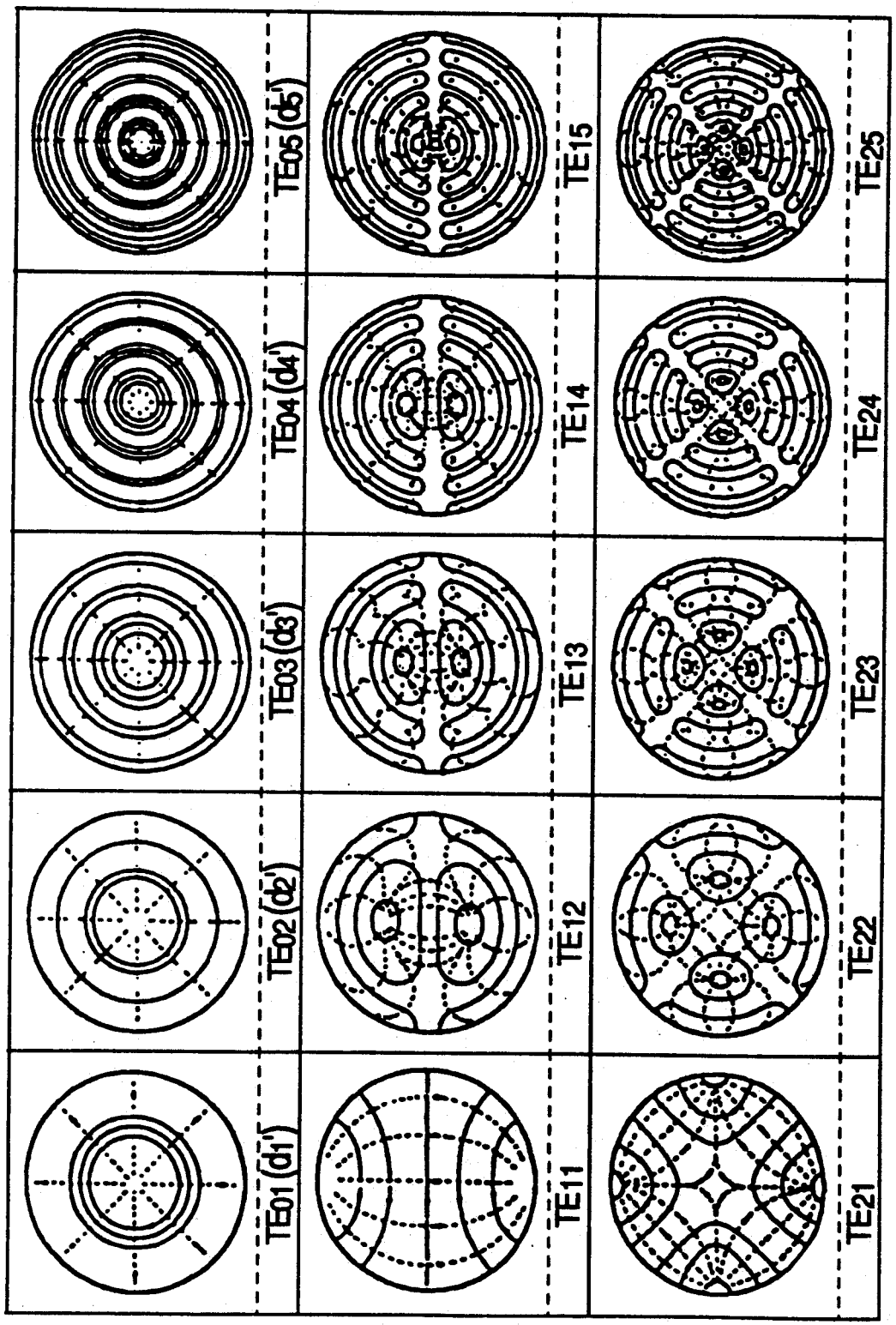
FIGS. 9a–b show microwave electric field patterns (transverse electric TE modes) excited in systems with metal walls.
Figure 9B:
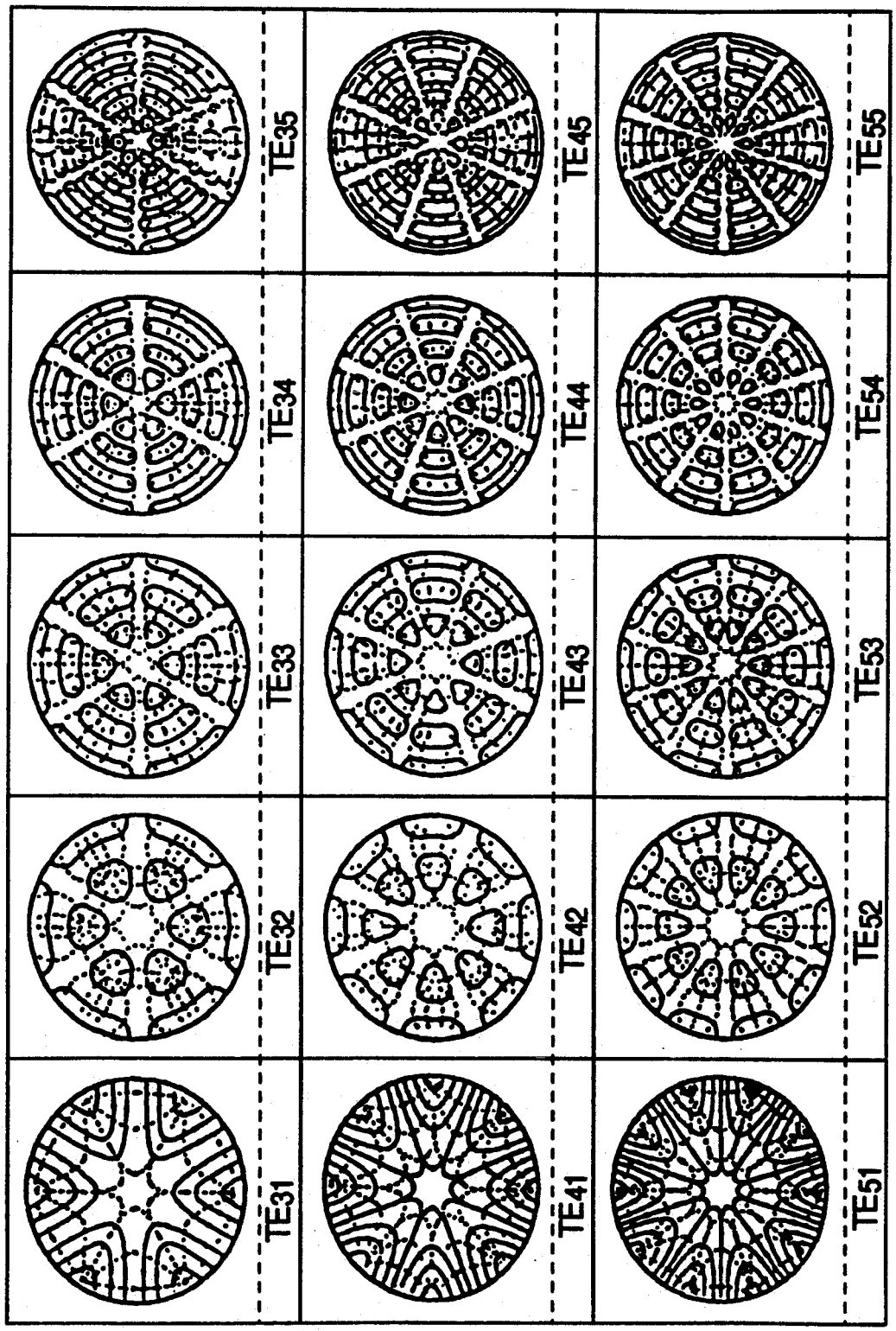
Figure 10A:
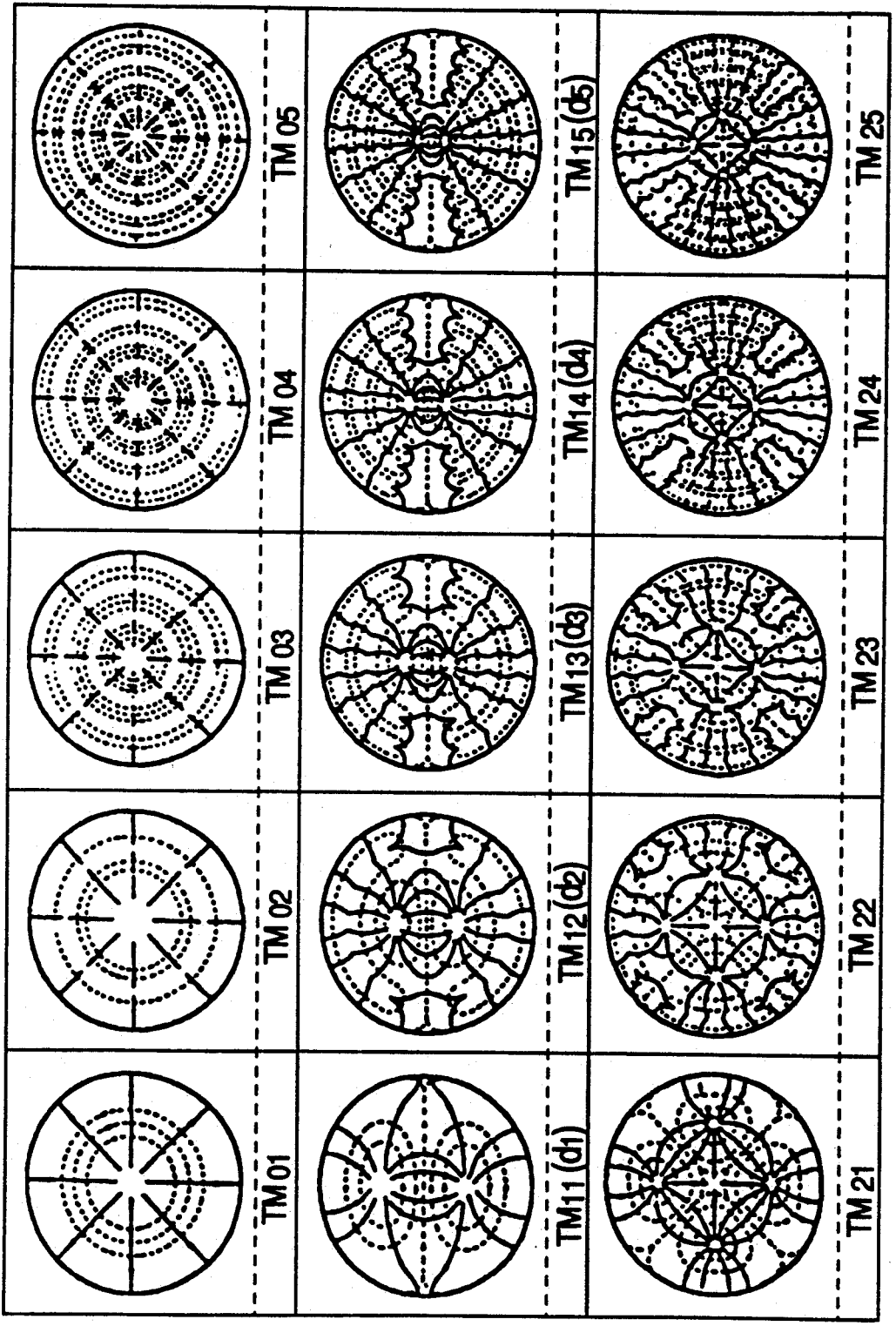
FIGS. 10a–b show magnetic electric field patterns (transverse magnetic TM modes) excited in systems with metal walls.
Figure 10B:
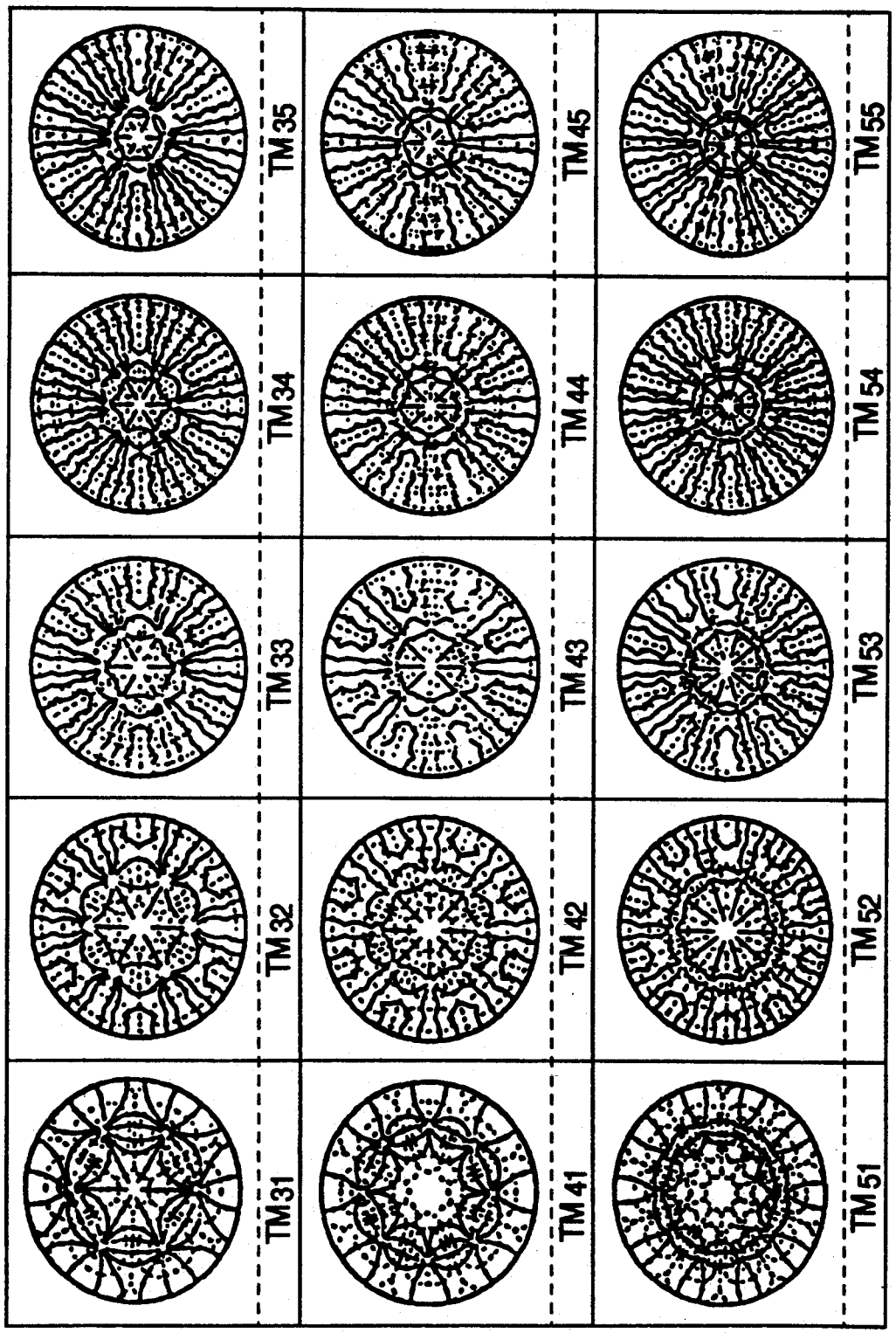

FIG. 9 shows several types of microwave electric field patterns excited in systems with metal walls. The transverse electric (TE) modes are conventionally used because they accelerate electrons more efficiently in the ECR interaction than the transverse-magnetic (TM) modes (as shown in FIG. 10). Also, the TM modes, except for the $TM_{1n}$ modes also have small transverse electric field amplitude on the axis, which can contribute to non-uniform plasma production. On the other hand, the TE modes have small electric field amplitude near the walls of the plasma formation chamber. To excite a uniform electric field amplitude requires exciting the correct combinations of modes together. Microwave/transformer window 100 alters the conditions at the boundary of plasma formation chamber 104 to excite combinations of microwave modes, and to increase the microwave electric field amplitude near the outer diameters of plasma formation chamber 104, over what they would be for conventional TE modes.

A quantitative calculation of the increase in microwave electric field amplitude at the outer diameters of the processing volume requires a detailed calculation including the exact geometry and dielectric properties of the material and the conditions for exciting the waveguide modes near the window. These calculations are most easily carried out by numerical simulation on a digital computer. However, a qualitative explanation of the effect is relatively straightforward. The dispersion relation for guided waves can be expressed as:

$$\lambda f = c/\sqrt{\epsilon} \rightarrow \lambda = c/f\sqrt{\epsilon}$$

where:
- $\lambda$ = guided wavelength of the microwaves
- $f$ = frequency of the microwaves
- $c$ = speed of light in vacuum
- $\epsilon$ = dielectric constant
- $\sqrt{\epsilon}$ = index of refraction.

From this relation, as the dielectric constant increases, the guided wavelength of the microwaves decreases In the situation wherein a material with higher dielectric constant surrounds a region of lower dielectric constant, the electric field is enhanced in the higher dielectric constant material. Since the wavelength is shorter in the high dielectric constant material, a proportionately larger fraction of the microwave energy propagates there. The net effect is as if the higher dielectric constant material pulls microwave power into itself at the expense of the microwave power in the region of lower dielectric constant. Hence, at the interface between the two dielectric media, the microwave electric field amplitude is enhanced over what it would be without the surrounding higher dielectric material. An alternative, but equivalent interpretation is that the "effective diameter" of the waveguide is larger, because the microwave wavelength is shorter in the higher dielectric constant material.

Figure 11A:
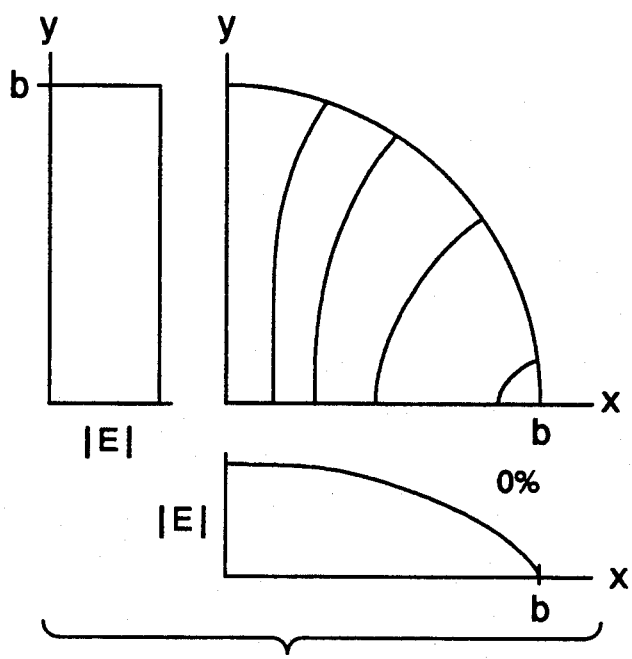
FIG. 11a shows a field pattern $|E|$ for the $TE_{11}$· mode without a dielectric insert.
Figure 11B:
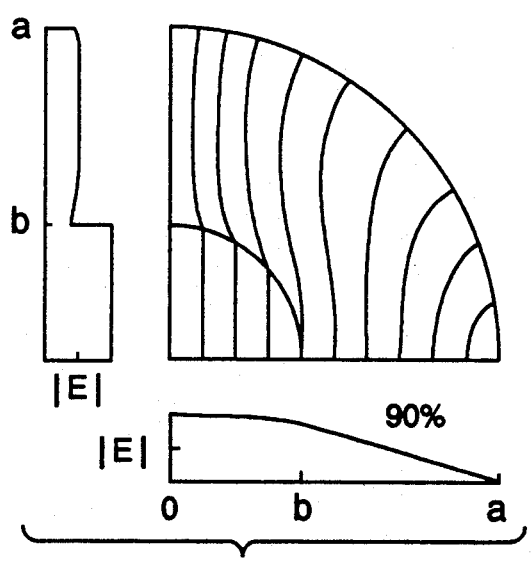
FIG. 11b shows a field pattern $|E|$ for the $TE_{11}$· mode with an annular insert having a dielectric constant of 2.5.
Figure 11C:
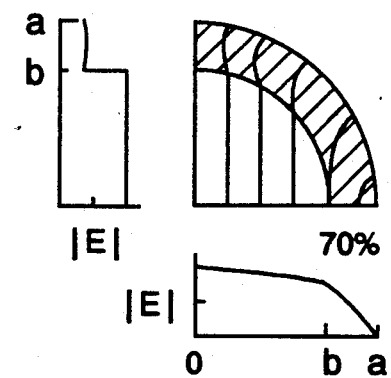
FIGS. 11c–e show field patterns $|E|$ for the $TE_{11}$· mode with annular inserts having a dielectric constant of 9, the inserts having the same outer diameter and progressively smaller inner diameters in FIGS. 11c–e, respectively.
Figure 11D:
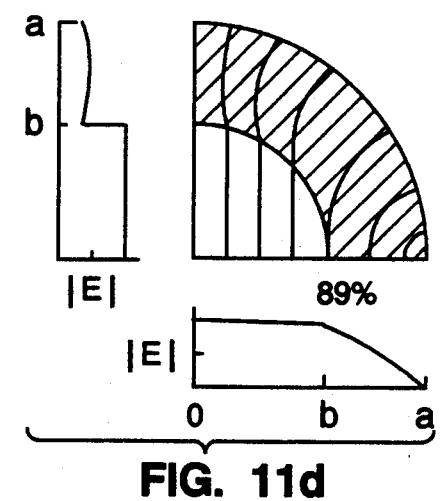
Figure 11E:
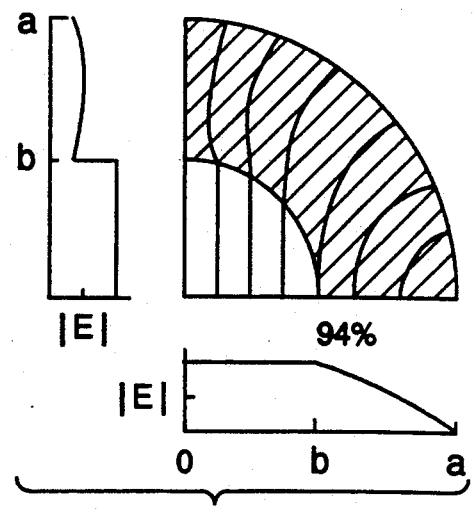

FIGS. 11a-e show calculations of the electric field lines and electric field amplitude in a cylindrical waveguide with a hollow dielectric insert. The field profile for the $TE_{11}$* mode is shown. FIG. 11a shows the field pattern without the dielectric insert. FIG. 11b shows the field pattern with an insert having a dielectric constant of 2.5, which corresponds roughly to quartz. FIG. 11c shows the field pattern for an insert with dielectric constant of 9, which corresponds approximately to alumina. Increasing either the dielectric constant or the thickness of the dielectric insert improves the uniformity of the electric field amplitude in the region interior to the dielectric material. Hence, the uniformity of the microwave processing would be improved in these cases.

For etching applications, the microwave window of the invention provides better etching results when pressure in the plasma source is adjusted such that the mean free path of the reactive species produced in the plasma source is small compared to the physical dimensions of the source. For ECR plasma etching, pressures above 1 mtorr are preferred.

Figure 12:
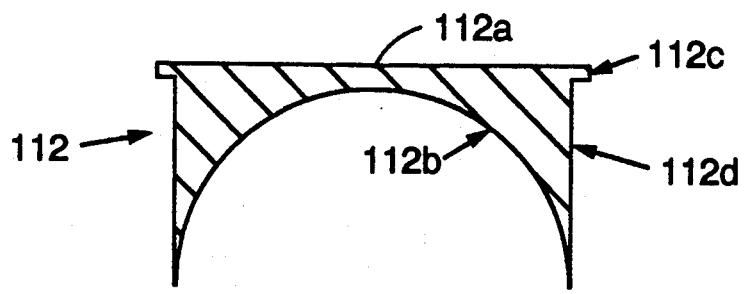

FIG. 12 shows a modification of window 100. In particular, window 112 can be of quartz with planar surface 112a on one side and a spherical concave surface 112b on the other side. The radius of spherical surface 112b can be 100 cm and the diameter of window 112 can be 200 cm. Window 112 includes flange 112c extending radially outwardly from outer periphery 112d at an end of window 112 adjacent surface 112a. Flange 112c provides a means for clamping window 112 and creating a seal by suitable means such as one or more O-rings between window 112 and a part against which window 112 is clamped. For instance, an O-ring can be placed around outer periphery 112d and butted against flange 112c to seal window 112 to plasma formation chamber 104.

Window 100, as shown in FIG. 8, can be used with cylindrical and/or rectangular waveguides. Likewise, plasma formation chamber 104 can be cylindrical, rectangular or have other cross-sectional configurations. Window 100 acts as a transformer in the sense that the mode pattern of the electric field can be changed. In particular, window 100 distributes electrical energy in plasma formation chamber 104 in a desired pattern while performing the additional function of sealing plasma formation chamber 104. Window 100 allows the microwave energy to be expanded from microwave guide 106 in a more uniform manner with or without horn 107. It is desirable, however, to provide a transition section such as horn 107 between microwave guide 106 and window 100. Horn 107 preferably has a smooth inner surface to maintain the microwave energy in the desired mode (e.g., the $TE_{11}$* mode for a cylindrical waveguide).

One particularly advantageous aspect of the invention is that the extraction wall usually provided between the plasma formation chamber and the reaction chamber in conventional plasma generating devices can be completely eliminated when window 100 is used in such a device. One reason for this is that window 100 can provide a plasma density which is substantially the same across most of the plasma formation chamber (e.g., from the central axis A to a distance of ⅔ the total distance to the outer wall of plasma formation chamber 104). Thus, a more uniform plasma covering a large area can be delivered to reaction chamber 108. It should be noted, however, that window 100 can also be advantageously used in plasma devices having a wall with an extraction outlet therein between plasma formation chamber 104 and reaction chamber 108. If desired, an extraction device such as one or more extraction electrodes can be provided around such an extraction outlet. Furthermore, window 100 provides advantageous results even when exciting coils 105 are omitted in such a device.

The detailed geometry of window 100 depends in part on the choice of material. In general, lower dielectric constant materials, such as quartz ($SiO_2$), BN, or glass require thicker physical dimensions for the window to perform equivalently to higher dielectric constant materials such as silicon nitride ($Si_3N_4$), alumina ($Al_2O_3$), zirconia ($ZrO_2$), or titania ($TiO_2$). Table 1 summarizes the design considerations for various geometries and materials for the invention.

Window 100 preferably comprises a unitary body of dielectric material. However, window 100 could optionally comprise more than one piece. For instance, as shown in FIG. 6b, window 100 could comprise a first disk 100c of dielectric material bonded or abutted to a second concave lens-shaped piece 100d of dielectric material. Such separate pieces 100c and 100d can be of the same dielectric material or different dielectric materials having the same or different dielectric constants. Also, window 100 can optionally include one or more coatings on surface 100a and/or surface 100b. For instance, coating 100e can be provided on surface 100b. Coating 100e could be a dielectric material such as boron nitride or silicon dioxide and window 100 could be a body of aluminum nitride or aluminum oxide.

TABLE 1

| Material Properties | Dielectric Constant | Other |
|---|---|---|
| Boron Nitride | ≈3.5 | Low microwave absorption. Compatible with silicon |

TABLE 1-continued

| Material | Dielectric Constant | Other |
|---|---|---|
| Quartz | ≈4 | processing. Good thermal shock resistance, low microwave absorption, compatible with silicon processing. |
| Silicon Nitride (Si$_3$N$_4$N) | ≈7 | Good thermal shock properties. Absorbs microwaves strongly at temperatures >400° C., then sublimates. Compatible with silicon processing. |
| Alumina (Al$_2$O$_3$) | ≈9 | Poor thermal shock resistance, low microwave absorption (but higher than quartz), highly resistant to halogen etching. |
| Zirconia (ZrO$_2$) | ≈27 | Good thermal shock resistance microwave absorption (absorption high at temperatures >700° C.). |
| Titania (TiO$_2$) | ≈81 | Can absorb microwaves strongly. Strong function of purity and stoichiometry. |

Figure 13A:
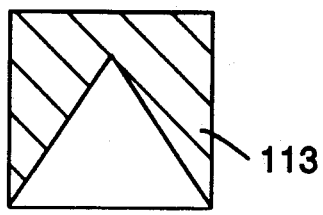
FIG. 13a shows a modification of the window shown in FIG. 6a wherein the concave surface is conical.
Figure 13B:
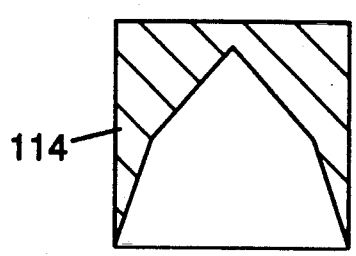
FIG. 13b shows a modification of the window shown in FIG. 6a wherein the concave surface is stepped with a conical central portion and a frusto-conical outer portion, the surface of the frusto-conical portion being tapered to a lesser extent than the surface of the conical portion.
Figure 13C:
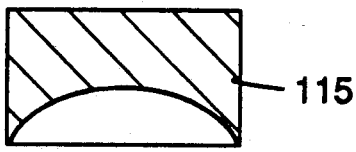
FIG. 13c shows a modification of the window shown in FIG. 6a wherein the concave surface is hyperbolic.
Figure 13E:
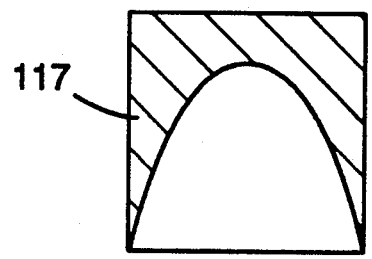
FIG. 13e shows a modification of the window shown in FIG. 6a wherein the concave surface is spherical.
Figure 13D:
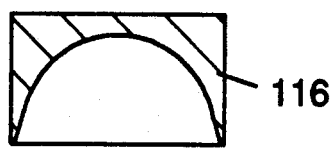
FIG. 13d shows a modification of the window shown in FIG. 6a wherein the concave surface is parabolic.
Figure 13F:
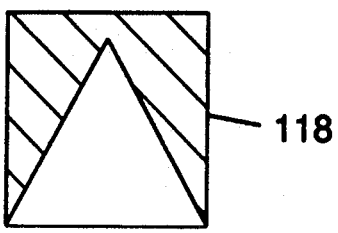
FIG. 13f shows a modification of the window shown in FIG. 6a wherein the concave surface is formed on a window which is rectangular in lateral cross-section and the concave surface is pyramidal in shape and formed by four triangular surfaces.
Figure 13G:
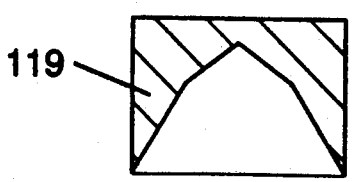
FIG. 13g shows a modification of the window shown in FIG. 6a wherein the concave surface is formed on a window which is rectangular in lateral cross-section and the concave surface is stepped with a four-sided pyramidal central portion and a four-sided truncated outer portion, the truncated outer portion being tapered to a lesser extent than the pyramidal central portion.

FIGS. 13a–g show various configurations of the window of the invention. FIG. 13a shows window 113 wherein the recessed surface is conical. FIG. 13b shows window 114 wherein the recessed surface is stepped with a conical central portion and a frusto-conical outer portion, the surface of the frusto-conical portion being tapered to a lesser extent than the surface of the conical portion. FIG. 13c shows window 115 wherein the recessed surface is hyperbolic. FIG. 13e shows window 117 wherein the recessed surface is parabolic. FIG. 13e shows window 117 wherein the recessed surface is spherical. FIG. 13f shows window 118 which is square or rectangular in lateral cross-section and the recessed surface is pyramidal in shape and formed by four triangular surfaces. FIG. 13g shows window 119 which is square or rectangular in lateral cross-section and the recessed surface is stepped with a four-sided pyramidal central portion and a four-sided truncated outer portion, the truncated outer portion being tapered to a lesser extent than the pyramidal central portion.

Figure 14A:
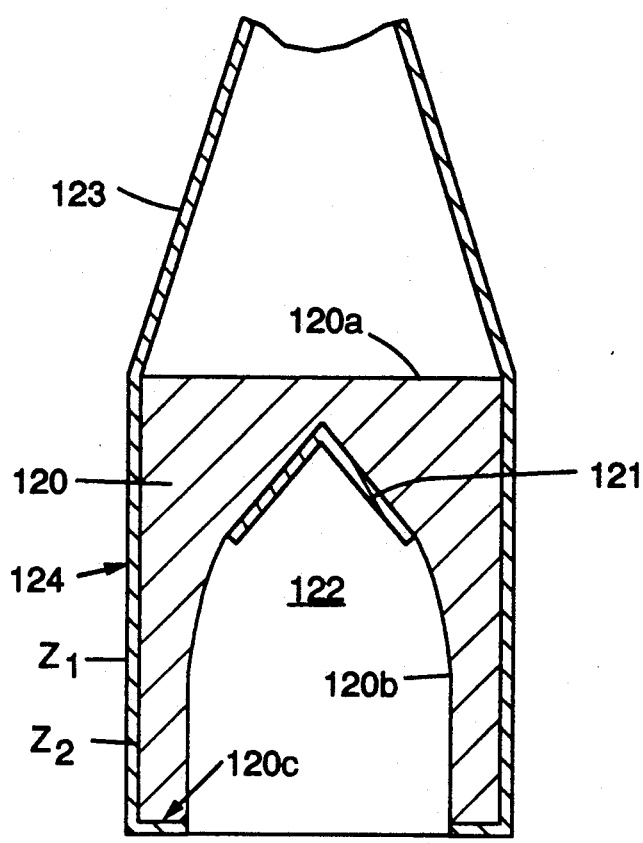
FIG. 14a shows another modification of the window shown in FIG. 6a wherein a central conical portion of the concave surface is covered by a metal shield and the window extends the complete length of the plasma formation chamber with the concave surface of the window forming a plasma formation region of the plasma formation chamber.
Figure 14B:
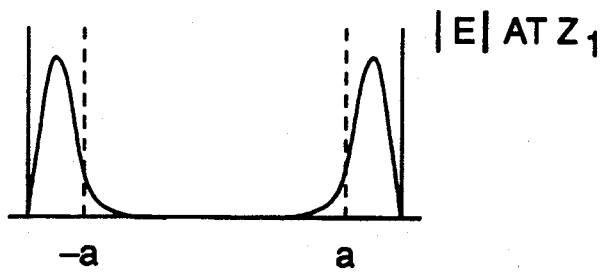
FIG. 14b shows that most of the microwave electric field at position $Z_1$ in FIG. 14a is contained within the dielectric window.
Figure 14C:
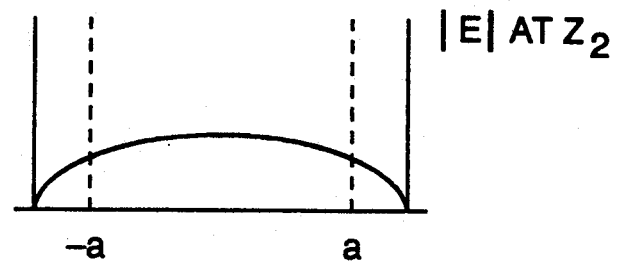
FIG. 14c shows that the electric field penetrates the plasma at position $Z_2$ in FIG. 14a, position $Z_2$ corresponding to the ECR zone.

FIGS. 14a–c show an extreme variation of the invention that may be useful in some applications. In this case, the combined thickness and dielectric constant of the material is sufficient to contain a large majority of the microwave power within the dielectric material, similar to total internal reflection in an optical fiber. For this configuration, interior to the dielectric, the microwave electric field amplitudes are largest in the interior of the dielectric and decrease exponentially towards the center of the plasma formation chamber.

FIG. 14a shows an embodiment of the invention wherein a central conical portion of recessed surface 120b of window 120 is covered by a metal shield 121 and plasma formation chamber 122 is surrounded by exciting coils (not shown). Window 120 extends the complete length of plasma formation chamber 122 with recessed surface 120b defining a plasma formation region of plasma formation chamber 122. FIG. 14b shows that most of the microwave electric field |E| is contained within window 120 at position Z$_1$. The ECR zone is located at position Z$_2$. FIG. 14c shows that the electric field |E| penetrates the plasma at the ECR zone because the dielectric constant of the plasma is much larger than the dielectric material of window 120.

In the arrangement shown in FIG. 14a, microwave energy is passed through a microwave guide (not shown) and into a transition zone of expanding diameter in a direction towards plasma formation chamber 122. The transition zone is defined by an inner conical surface of horn 123. Planar surface 120a of window 120 faces the interior of horn 123 and recessed surface 120b faces and defines a plasma forming region in plasma formation chamber 122. Plasma formation chamber 122 includes metal wall 124 which surrounds the outer periphery of window 120. A radially extending portion of wall 124 covers annular end surface 120c of window 120. Shield 121 is used to ensure the microwave power is contained within the dielectric material until it reaches the ECR zone. However, shield 121 can be omitted in the embodiment shown in FIG. 14a to obtain a different mixture of electric and magnetic modes. For instance, without shield 121 it may be possible to obtain stronger electric fields in the center of chamber 122. Also, exciting coils (not shown in FIG. 14a) for creating the ECR condition can be omitted when window 120 is used in a non-ECR plasma generating device. However, when exciting coils 105 (such as exciting coils shown in FIG. 8) are used to provide ECR, window 120 is also effective in making the TM modes more uniform across the cross-section of the plasma formation chamber.

While the invention has been described with reference to the foregoing embodiments, various changes and modifications can be made thereto which fall within the scope of the appended claims.

What is claimed is:

1. A microwave plasma processing device including a plasma generation chamber which generates plasma by exciting electron cyclotron resonance using microwaves introduced through a microwave lead-in opening in an end wall of the plasma formation chamber, the microwave lead-in opening having a cross section smaller than a cross section of the plasma formation chamber, the microwave plasma processing device including a microwave-penetrable substance on a side of the plasma generation chamber facing the microwave lead-in opening, the microwave-penetrable substance extending over an entire cross-section of the chamber, the microwave-penetrable substance having a thickness between a surface thereof facing an interior of the plasma generation chamber and another surface opposite thereto, the thickness becoming greater in a direction from a center of the plasma generation chamber to a periphery thereof.

2. A microwave plasma processing device including a plasma generation chamber which generates plasma by exciting electron cyclotron resonance using microwaves introduced through a microwave lead-in opening, the microwave plasma processing device including a first microwave-penetrable substance supported in the microwave lead-in opening with one side of the first microwave-penetrable substance being uniplanar with an inner surface of the plasma generation chamber, and a second microwave-penetrable substance being supported on a side of the plasma generation chamber facing the microwave lead-in opening, the second microwave-penetrable substance extending over an entire cross-section of the chamber, the second microwave-penetrable substance having a thickness between a surface thereof facing an interior of the plasma generation chamber and another surface opposite thereto, the thickness becoming greater in a direction from a center of the plasma generation chamber to a periphery thereof.

3. A microwave transmitting window, comprising:

a solid body of dielectric material, the body including first and second surfaces spaced apart in an axial direction, the body including an outer periphery extending between the first and second surfaces, the first surface being planar and extending perpendicularly to the axial direction, the second surface being recessed such that the body has a non-uniform thickness between the first and second surfaces, the thickness increasing in a direction towards the outer periphery of the body.

4. The microwave transmitting window of claim 3, wherein the first surface is a continuous, uninterrupted surface extending inwardly from the outer periphery, the second surface is a continuous, uninterrupted surface extending inwardly from the outer periphery, the outer periphery is a continuous, uninterrupted surface extending axially from the first surface to the second surface, and the outer periphery has a uniform width in a transverse direction perpendicular to the axial direction.

5. The microwave transmitting window of claim 3, wherein the body is cylindrical or rectangular in axial cross-section.

6. The microwave transmitting window of claim 3, wherein the recessed surface is conical or spherical or parabolic or hyperbolic with respect to the axial direction.

7. The microwave transmitting window of claim 3, wherein the recessed surface includes a conical central portion and a frusto-conical outer portion.

8. The microwave transmitting window of claim 7, wherein the frusto-conical outer portion is tapered with respect to the axial direction to a lesser extent than the conical central portion.

9. The microwave transmitting window of claim 3, wherein the recessed surface extends radially inwardly from the outer periphery of the body, or the second surface includes an outer planar portion extending perpendicularly to the axial direction and the recessed surface extends radially inwardly from the outer planar portion.

10. The microwave transmitting window of claim 9, further comprising a metal shield covering a central portion of the recessed surface.

11. The microwave transmitting window of claim 3, wherein the recessed surface is frusto-conical, the second surface including a planar outer portion and a extending from the central portion to the outer portion.

12. The microwave transmitting window of claim 3, wherein the recessed surface is pyramidal in shape and formed by four triangular surfaces.

13. The microwave transmitting window of claim 3, wherein the recessed surface includes a pyramidal central portion formed by four triangular surfaces and a truncated outer portion formed by four trapezoidal surfaces.

14. The microwave transmitting window of claim 13, wherein the truncated outer portion is tapered with respect to the axial direction to a lesser extent than the pyramidal central portion.

15. The microwave transmitting window of claim 3, further comprising a metal shield covering a central portion of the recessed surface.

16. The microwave transmitting window of claim 3, further including a flange extending radially outwardly from the outer periphery of the body.

17. The microwave transmitting window of claim 16, wherein the flange is adjacent the first surface of the body.

18. The microwave transmitting window of claim 3, wherein the body comprises at least two discrete parts.

19. The microwave transmitting window of claim 3, further comprising a member of dielectric material, the member including a planar surface abutting the planar surface of the body.

20. The microwave transmitting window of claim 19, wherein the member has an outer periphery spaced radially inwardly of the outer periphery of the body.

21. A plasma generating device, comprising:

a plasma formation chamber having first and second ends thereof spaced apart in an axial direction, a first opening in the first end for passing microwave energy into the plasma formation chamber and a second opening in the second end for passing plasma outwardly of the plasma formation chamber;

a reaction chamber adjacent the second end of the plasma formation chamber, the reaction chamber including a substrate support aligned in the axial direction with the second opening; and a microwave transmitting window sealing the first opening, the window comprising a body of dielectric material, the body including first and second surfaces spaced apart in the axial direction, the body including an outer periphery extending between the first and second surfaces, the first surface being planar and extending perpendicularly to the axial direction, and the second surface being recessed such that the body has a non-uniform thickness between the first and second surfaces, the thickness increasing in a direction towards the outer periphery of the body.

22. The plasma generating device of claim 21, wherein the plasma formation chamber is formed by at least one wall which extends parallel to the axial direction and the second opening is formed by one axial end of the at least one wall, the second opening having a cross section equal to a cross section of the plasma formation chamber.

23. The plasma generating device of claim 22, wherein the plasma formation chamber is cylindrical in axial cross-section and the at least one wall comprises a cylindrical wall, the device further including a liner of dielectric material completely covering an inner periphery of the cylindrical wall.

24. The plasma generating device of claim 21, wherein the first surface is a continuous, uninterrupted surface extending inwardly from the outer periphery, the second surface is a continuous, uninterrupted surface extending inwardly from the outer periphery, the outer periphery is a continuous, uninterrupted surface extending axially from the first surface to the second surface, and the outer periphery has a uniform width in a transverse direction perpendicular to the axial direction.

25. The plasma generating device of claim 21, wherein the body is cylindrical or rectangular in cross-section.

26. The plasma generating device of claim 21, wherein the recessed surface is conical or spherical or parabolic or hyperbolic with respect to the axial direction.

27. The plasma generating device of claim 21, wherein the recessed surface includes a conical central portion and a frusto-conical outer portion.

28. The plasma generating device of claim 21, wherein the recessed surface extends radially inwardly from the outer periphery of the body or the second surface includes an outer planar portion extending perpendicularly to the axial direction and the recessed surface extends radially inwardly from the outer planar portion.

29. The plasma generating device of claim 21, wherein the recessed surface is frusto-conical, the second surface including a planar outer portion and a planar central portion, the frusto-conical surface extending from the central portion to the outer portion.

30. The plasma generating device of claim 21, wherein the recessed surface is pyramidal in shape and formed by four triangular surfaces.

31. The plasma generating device of claim 21, wherein the recessed surface includes a pyramidal central portion formed by four triangular surfaces and a truncated outer portion formed by four trapezoidal surfaces.

32. The plasma generating device of claim 21, further comprising a metal shield covering a central portion of the recessed surface.

33. The plasma generating device of claim 21, further including a flange extending outwardly from the outer periphery of the body and at least one O-ring cooperating with the flange to seal the plasma formation chamber.

34. The plasma generating device of claim 21, further comprising a microwave guide and a microwave transmitting horn extending between the microwave guide and the window.

35. The plasma generating device of claim 34, wherein the horn has a larger opening at an end thereof facing the window than at an end thereof facing the waveguide, the larger opening being equal in size to a size of the plasma formation chamber.

36. The plasma generating device of claim 21, wherein the body comprises at least two discrete parts.

37. The plasma generating device of claim 21, further comprising a member of dielectric material, the member including a planar surface abutting the planar surface of the body, the member having an outer periphery spaced radially inwardly of the outer periphery of the body.

* * * * *